(12) United States Patent
Bao et al.

(10) Patent No.: US 9,570,582 B1
(45) Date of Patent: Feb. 14, 2017

(54) METHOD OF REMOVING DUMMY GATE DIELECTRIC LAYER

(71) Applicants: Yu Bao, Shanghai (CN); Xiaoqiang Zhou, Shanghai (CN); Jun Zhou, Shanghai (CN); Bin Zhong, Shanghai (CN); Haifeng Zhou, Shanghai (CN)

(72) Inventors: Yu Bao, Shanghai (CN); Xiaoqiang Zhou, Shanghai (CN); Jun Zhou, Shanghai (CN); Bin Zhong, Shanghai (CN); Haifeng Zhou, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/235,208

(22) Filed: Aug. 12, 2016

(30) Foreign Application Priority Data

Mar. 11, 2016 (CN) .......................... 2016 1 0141518

(51) Int. Cl.
| | | |
|---|---|---|
| *H01L 21/31* | (2006.01) | |
| *H01L 21/02* | (2006.01) | |
| *H01L 29/66* | (2006.01) | |
| *H01L 21/28* | (2006.01) | |
| *H01L 21/311* | (2006.01) | |
| *H01L 29/51* | (2006.01) | |

(52) U.S. Cl.
CPC ..... *H01L 29/66545* (2013.01); *H01L 21/0206* (2013.01); *H01L 21/28017* (2013.01); *H01L 21/31116* (2013.01); *H01L 29/517* (2013.01)

(58) Field of Classification Search
CPC ........... H01L 29/66545; H01L 21/0206; H01L 29/517; H01L 21/31116; H01L 21/28017; H01L 21/8238; H01L 21/823842; H01L 21/28185; H01L 21/28194; H01L 29/78; H01L 29/513
See application file for complete search history.

(56) References Cited

U.S. PATENT DOCUMENTS

2011/0086502 A1* 4/2011 Yeh ..................... H01L 29/7833
438/585

* cited by examiner

*Primary Examiner* — Selim Ahmed

(57) ABSTRACT

A method of removing a dummy gate dielectric layer is provided. Firstly a first plasma containing F is utilized to remove the dummy dielectric layer which contains Si and O. Then a second plasma containing $H_2$ is utilized to remove fluorine compound on the surface of the semiconductor substrate. Since the fluorine residue formed after the first plasma treatment reacts with the second plasma to form a gaseous product HF, the fluorine element can be taken away from the semiconductor device with the HF, which prevents inversion layer offset and gate current leakage occurred in the subsequent processing steps due to the fluorine element.

16 Claims, 12 Drawing Sheets

--Prior Art--

--Prior Art--

--Prior Art--

--Prior Art--

--Prior Art--

--Prior Art--

METHOD OF REMOVING DUMMY GATE DIELECTRIC LAYER

CROSS-REFERENCE TO RELATED APPLICATION

This application claims the priority benefit of China patent application serial No. 201610141518.6 filed Mar. 11, 2016. The entirety of each of the above-mentioned patent applications is hereby incorporated by reference herein and made a part of this specification.

FIELD OF THE INVENTION

The present invention relates to semiconductor manufacturing technology, and more particularly, to a method of removing a dummy gate dielectric layer.

BACKGROUND OF THE INVENTION

Gate-last process is an approach to fabricate metal gate structures, which is characterized by forming a metal gate after performing ion implantation and high-temperature annealing to source/drain regions. The gate-first process is another approach, which is characterized by forming a metal gate before performing ion implantation and high-temperature annealing to source/drain regions.

Compared with the gate-first process, since the gate-last process protects the metal gate from the high-temperature annealing process, which is usually implanted at a temperature over 1000° C., it has the advantages of lower material requirement for the metal gate and higher process integration. Therefore, the gate-late process has been widely applied in the semiconductor technology.

The conventional gate-late process comprises the following steps:

Step 1: referring to FIG. 1, a semiconductor substrate 1 is provided. A dummy gate dielectric layer 4 and a dummy gate electrode 3 are formed in sequence on a surface of the semiconductor substrate 1. Then, source/drain regions are formed in the semiconductor substrate 1 on opposing sides of the dummy gate electrode 3 and metal silicide 11 is formed in an upper portion of the source/drain regions. After that, sidewall spacers 2 are formed on opposing sides of the dummy gate electrode 3.

Step 2: referring to FIG. 1, an interlayer insulator layer 5, i.e., a silicon nitride layer, and an interlayer dielectric layer (IDL) 6, are successively deposited on a semiconductor structure formed after the Step 1. Referring to FIG. 2, a portion of the silicon nitride layer 5 and the interlayer dielectric layer 6 above the dummy gate electrode 3 and the sidewall spacers 2 are removed by chemical mechanical polishing.

Step 3: referring to FIG. 3 and FIG. 4, the dummy gate electrode 3 and the dummy gate dielectric layer 4 below the dummy gate electrode 3 are removed to expose the semiconductor substrate 1.

Step 4: referring to FIG. 5, a gate dielectric layer 7 and a metal gate 8 are formed on the surface of the semiconductor substrate 1 within the sidewall spacers 2.

In the above Step 3, after the removal of the dummy gate electrode 3, the dummy gate dielectric 4 is conventionally removed by wet etching, that is, using an acid solution to remove the dummy gate dielectric 4. However, in order to reduce manufacturing cost and subsequent overlay error, photoresist is not applied to the interlayer dielectric layer 6 outside the sidewall spacers 2. As a result, the interlayer dielectric layer 6 may be etched together with the dummy gate dielectric 4 as it also contains oxide like the dummy gate dielectric 4. Referring to FIG. 3, the dummy gate dielectric layer 4 is formed with high density due the high process temperature of approximately 1000° C. and less impurities exist on the surface of the semiconductor substrate 1 within the sidewall spacers 2. By contrast, the interlayer dielectric layer 6 outside the sidewall spacers 2 is formed with low density due to the lower process temperature of approximately 400° C. and more impurities in this region. When the acid solution etches the dummy gate dielectric layer 4 together with the interlayer dielectric layer 6, the etch rate of the interlayer dielectric layer 6 with low density is faster than that of the dummy gate dielectric layer 4 with high density, which results in a structure as illustrated in FIG. 6. Due to the high etch rate of the interlayer dielectric layer 6 outside the sidewall spacers 2, when the dummy gate dielectric layer 4 within the sidewall spacers 2 is removed, the height of the interlayer dielectric layer 6 is already lower than the height of the sidewall spacers 2, such semiconductor device cannot be treated with subsequent process steps and has to be scrapped.

To solve the problem above, a remote plasma of a mixing gas comprising $NF_3$ and $NH_3$ is used to remove the dummy gate dielectric layer 4. Since the etch rate of the dummy gate dielectric 4 and that of the interlayer dielectric layer 6 by the plasma of $NF_3/NH_3$ are the same, the height reduction rate of the dummy gate dielectric layer 4 within the sidewall spacers 2 and that of the interlayer dielectric layer 6 outside the sidewall spacers 2 keep consistent. However, after removing the dummy gate dielectric layer 4 and the interlayer dielectric layer 6, fluorine residue may remain on the surface of semiconductor device. Particularly, the fluorine residue on the surface of the semiconductor substrate 1 may cause offset of the inversion layer between the source/drain regions and increased gate current leakage, which affects the performance of the semiconductor device.

In view of the drawbacks mentioned above, there exists a need to develop a method to protect the semiconductor devices from the effect of the fluorine residue on the surface of the semiconductor substrate.

BRIEF SUMMARY OF THE DISCLOSURE

The main object of the present invention is to overcome the defect of the conventional technology, and provides a method of removing a dummy gate dielectric layer. Before forming a metal gate, a first plasma which contains fluorine is used to remove the dummy gate dielectric layer on a surface of a semiconductor substrate to expose the semiconductor substrate. Then a second plasma which contains $H_2$ is used to remove fluorinated compound on the surface of semiconductor substrate. Since the fluorinated compound is removed by $H_2$ before the formation of the metal gate, the semiconductor device can be protected from the effect of the fluorine residue on the surface of the semiconductor substrate.

To achieve above objects, the present invention provides a method of removing a dummy gate dielectric comprising removing a dummy gate dielectric layer on a surface of a semiconductor substrate by a first plasma to expose the semiconductor substrate and then removing fluorine compound on the surface of the semiconductor substrate by a second plasma. Wherein, the dummy gate dielectric layer contains Si and O, the first plasma contains F, and the second plasma contains $H_2$.

Preferably, the first plasma contains $NF_3$ and $NH_3$.

Preferably, the second plasma is a remote plasma.

Preferably, the second plasma is $H_2$ plasma which removes the fluorine compound on the surface of the semiconductor substrate at a temperature between 0° C. and 400° C. at a flow rate between 1000 sccm and 15000 sccm at a radio-frequency power between 50 W and 1500 W.

Preferably, the second plasma is $H_2/N_2$ plasma which removes the fluorine compound on the surface of the semiconductor substrate at a temperature between 0° C. and 400° C. at a flow rate of $H_2$ between 1000 sccm to 15000 sccm and a flow rate of $N_2$ between 1000 sccm to 20000 sccm, and at a radio-frequency power between 50 W to 1500 W.

Preferably, the step of removing the dummy gate dielectric layer on a surface of a semiconductor substrate by a first plasma and the step of removing fluorine compound on the surface of the semiconductor substrate by a second plasma are performed in a same reaction chamber.

Preferably, a material of the dummy gate dielectric layer contains $SiO_2$ or SiNO.

The present invention also provides a method of fabricating a metal gate, which includes: forming a dummy gate dielectric layer and a dummy gate electrode on a surface of a semiconductor substrate; forming sidewall spacers on opposing sides of dummy gate electrode and the dummy gate dielectric layer; forming source/drain regions in the semiconductor substrate; depositing an interlayer insulating layer and an interlayer dielectric layer; removing a portion of the interlayer insulating layer and the interlayer dielectric layer above the dummy gate electrode to expose the dummy gate electrode; removing the dummy gate dielectric layer by a first plasma to expose the semiconductor substrate; then removing a fluorinated compound on the surface of the semiconductor substrate by a second plasma; forming a gate dielectric layer and a metal gate in sequence on the surface of the semiconductor substrate within sidewall spacers; wherein a material of the dummy gate dielectric layer contains Si and O; the first plasma contains F, and the second plasma contains $H_2$.

Preferably, a dielectric constant of the gate dielectric layer is higher than that of the dummy gate dielectric layer.

Preferably, a material of the gate dielectric layer is $HfO_2$ or $ZrO_2$.

Compared with the prior art, the present invention utilizes a first plasma containing F to remove the dummy gate dielectric layer containing Si and O and expose the semiconductor substrate, and then utilizes a second plasma containing $H_2$ to remove the fluorinated compound on the exposed surface of the semiconductor substrate.

The first plasma containing F removes the dummy gate dielectric layer but produces fluorinated compound on the surface of the semiconductor device. Therefore, the second plasma containing $H_2$ is introduced and reacts with the fluorinated compound to produce gaseous products mainly HF, which takes the fluorine element away from the semiconductor device. Accordingly, the content of the fluorine element on the semiconductor substrate is reduced, which prevents the impact of the fluorine element on the inversion layer and the gate current leakage in the subsequent processing steps.

DETAILED DESCRIPTION OF THE EMBODIMENTS

To understand the present invention more clearly and easily, the present invention will now be descried more fully hereinafter with reference to the accompanying drawings. The present invention shall not be limited to the embodiments set forth herein. General substitution known by the technical personnel in the art is within the protection scope of the present invention.

With reference to FIGS. 7-12, the method of removing a dummy gate dielectric layer according to the present invention will be described in details.

Figure 1:
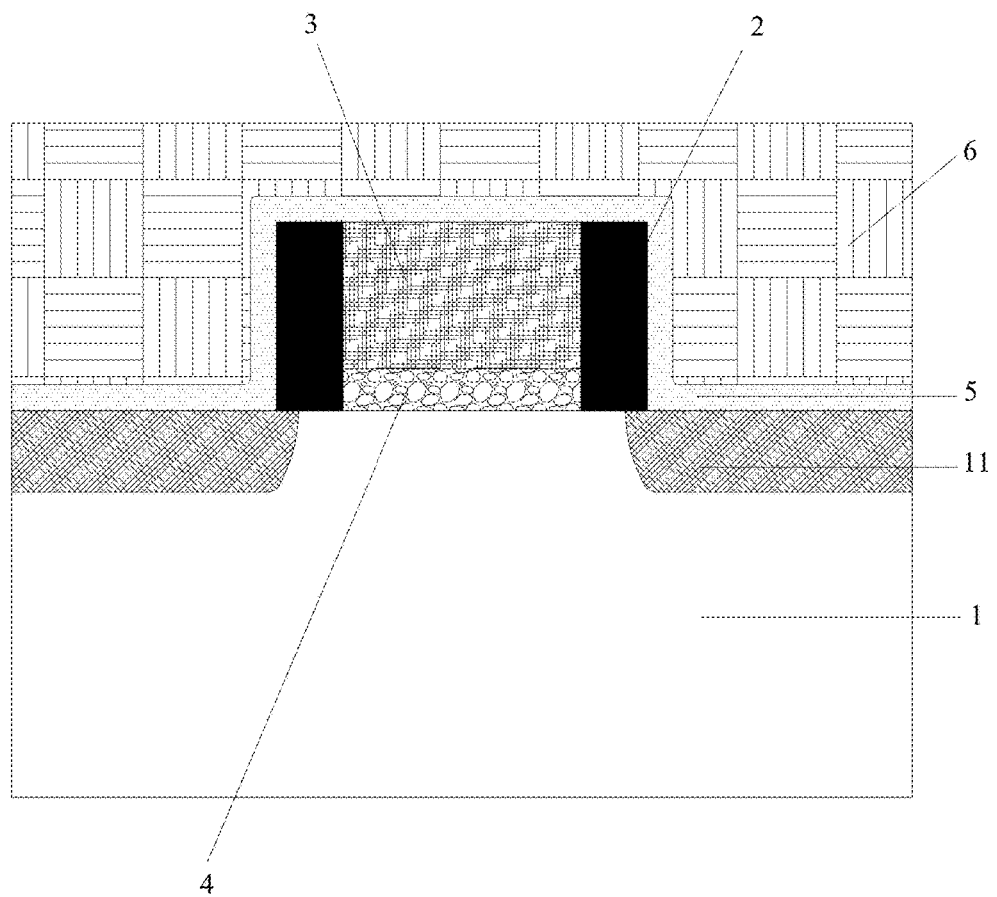
FIG. 1 is a cross-sectional view of a semiconductor structure after the step of depositing a silicon nitride layer and an interlayer dielectric layer in the conventional gate-last process.
Figure 2:
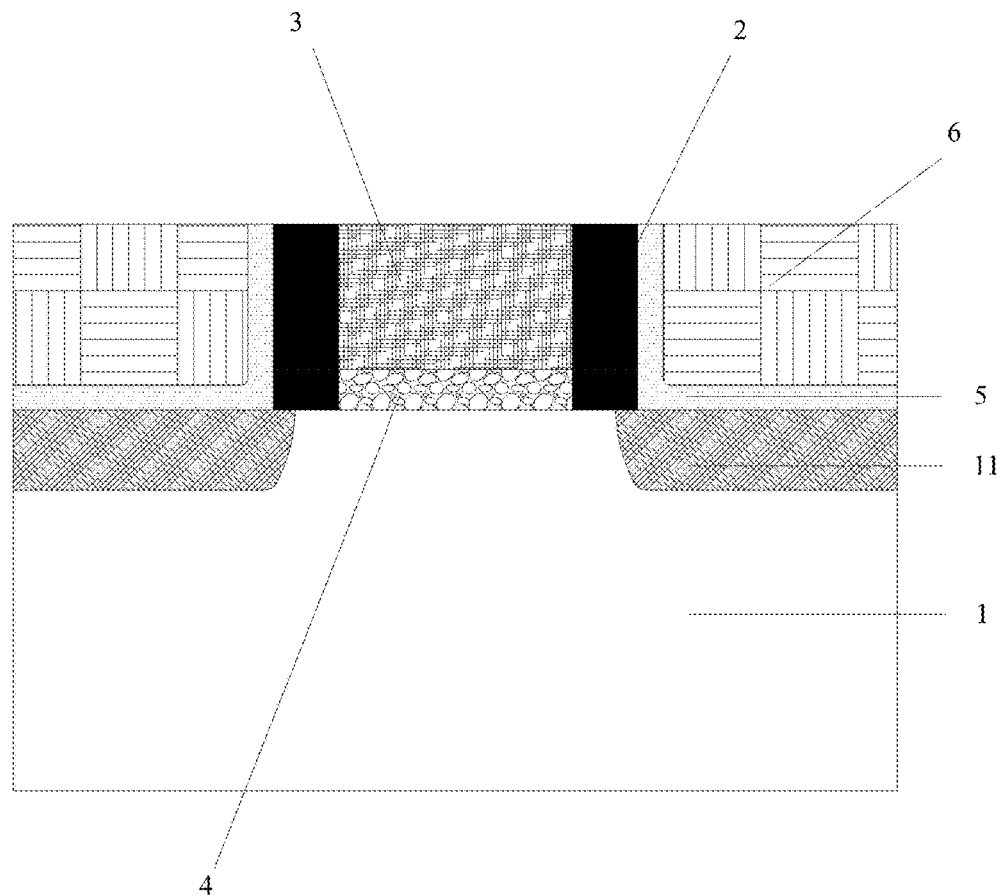
FIG. 2 is a cross-sectional view of a semiconductor structure at the stage of removing the silicon nitride layer in the conventional gate-last process.
Figure 3:
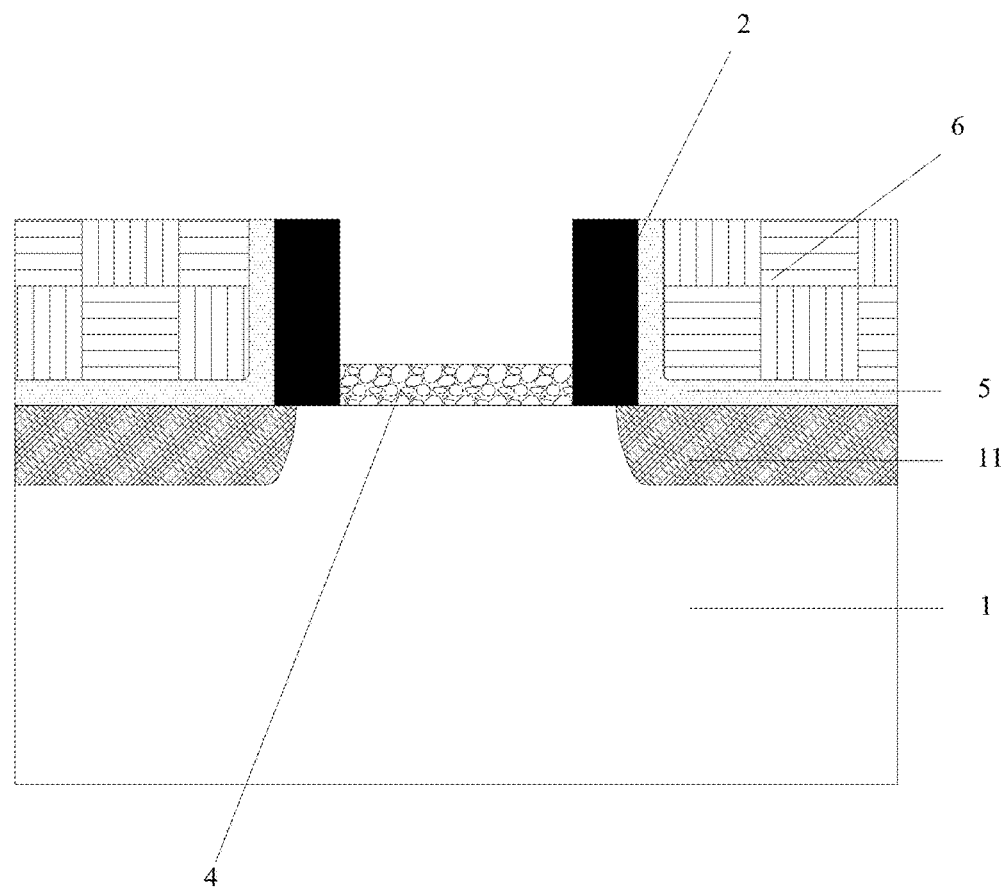
FIG. 3 is a cross-sectional view of a semiconductor structure at the stage of removing the dummy gate electrode in the conventional gate-last process.
Figure 4:
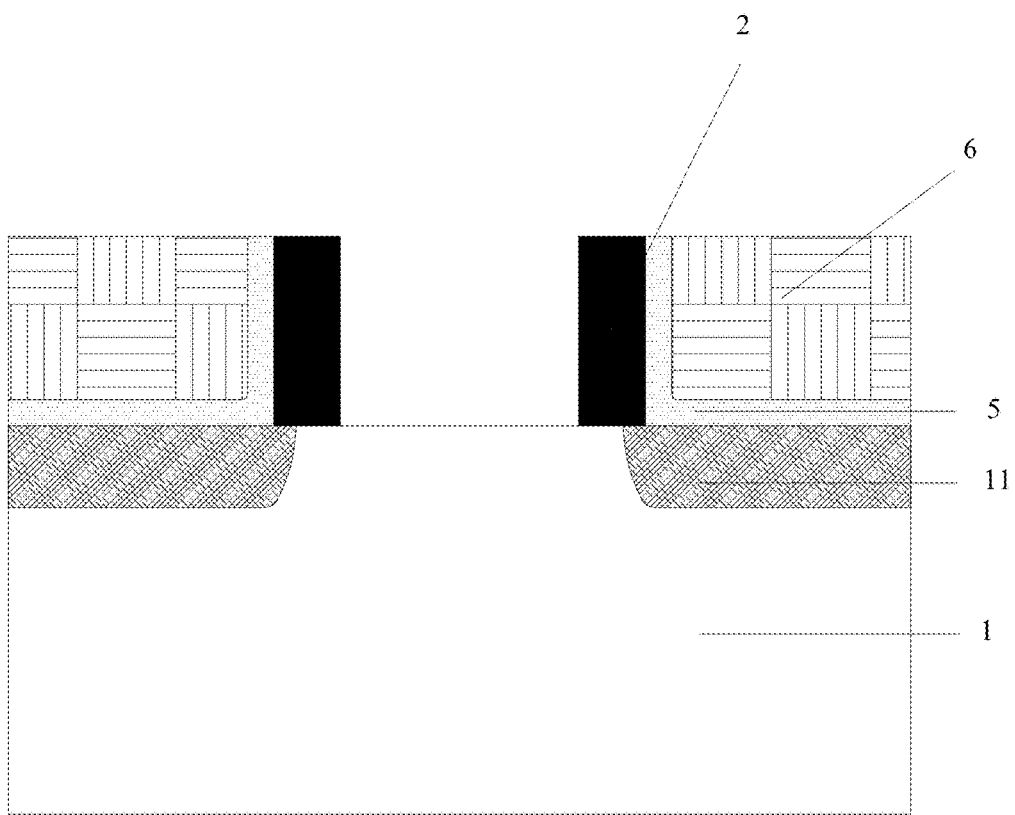
FIG. 4 is a cross-sectional view of a semiconductor structure at the stage of removing the dummy gate dielectric layer in the conventional gate-last process.
Figure 5:
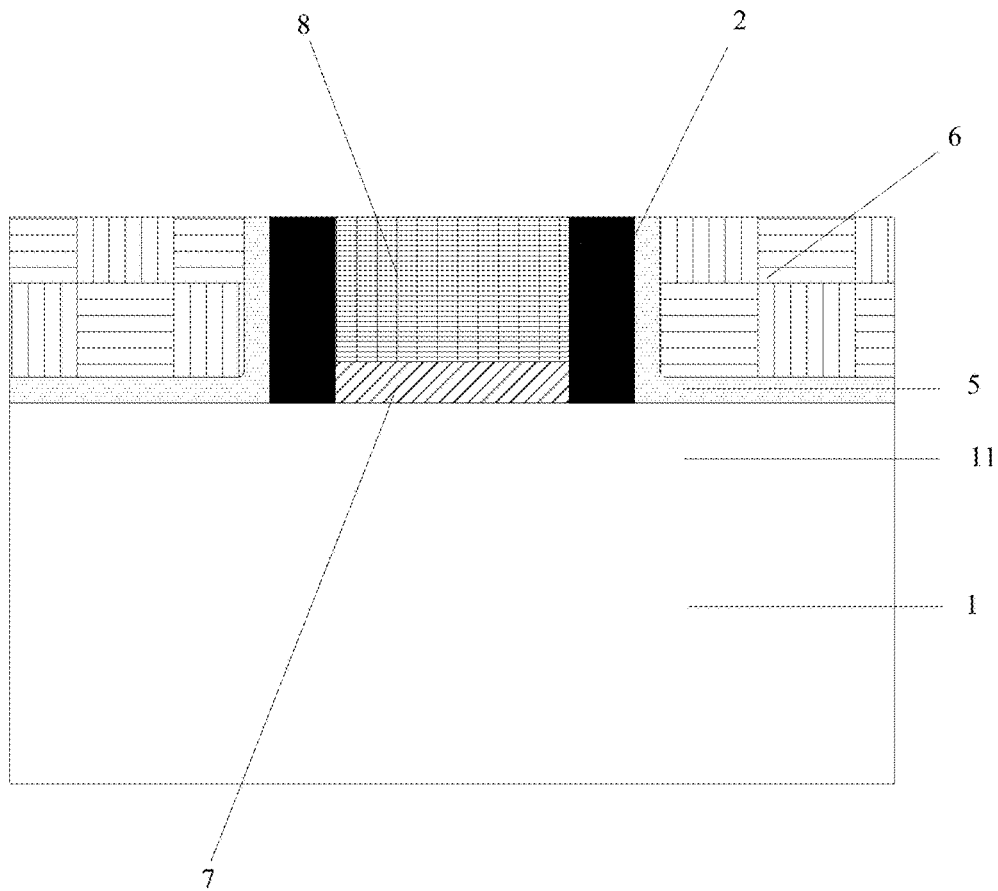
FIG. 5 is a cross-sectional view of a semiconductor structure at the stage of forming a gate dielectric layer and a metal gate in the conventional gate-last process.
Figure 6:
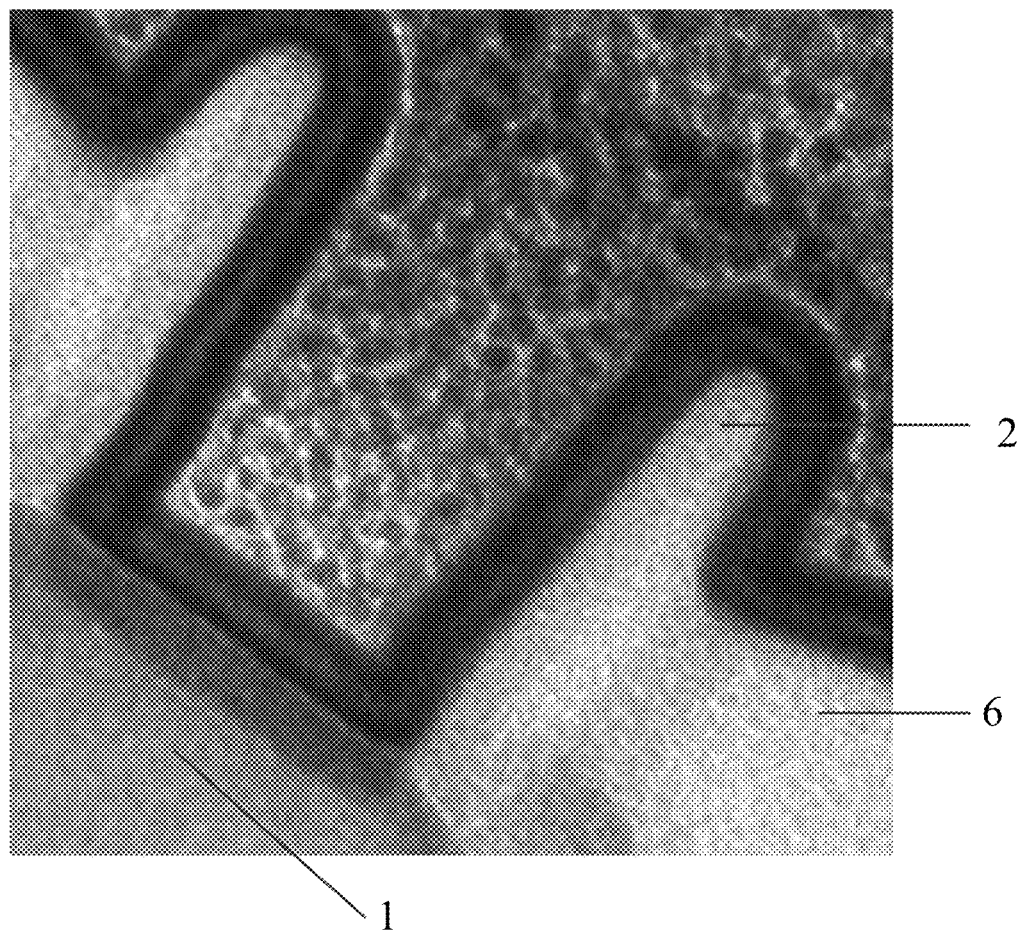
FIG. 6 is an image of a semiconductor structure at the stage of removing the gate dielectric layer and the interlay dielectric layer by wet etching.
Figure 7:
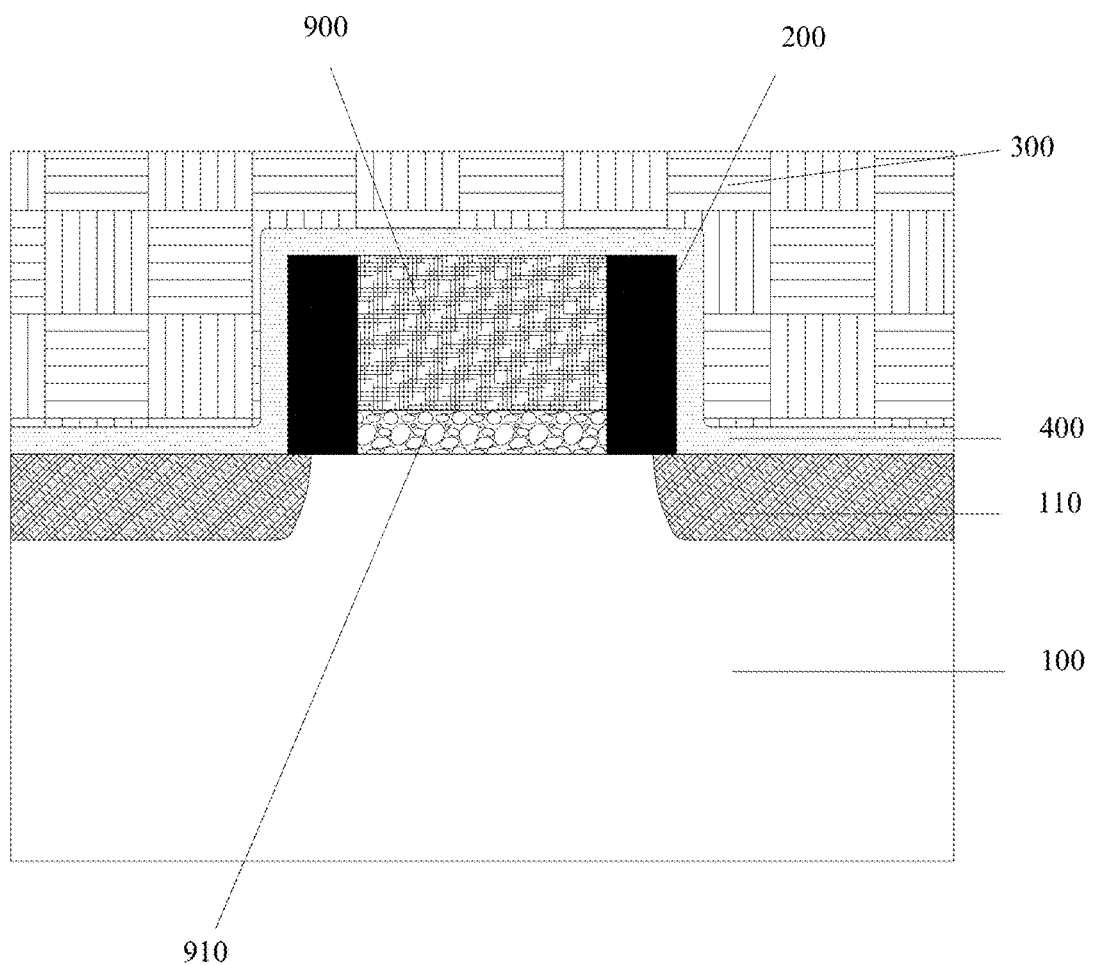
FIG. 7 is a cross-sectional view of a semiconductor structure at the stage of depositing a silicon nitride layer and an interlayer dielectric layer in an embodiment according to the present invention.
Figure 8:
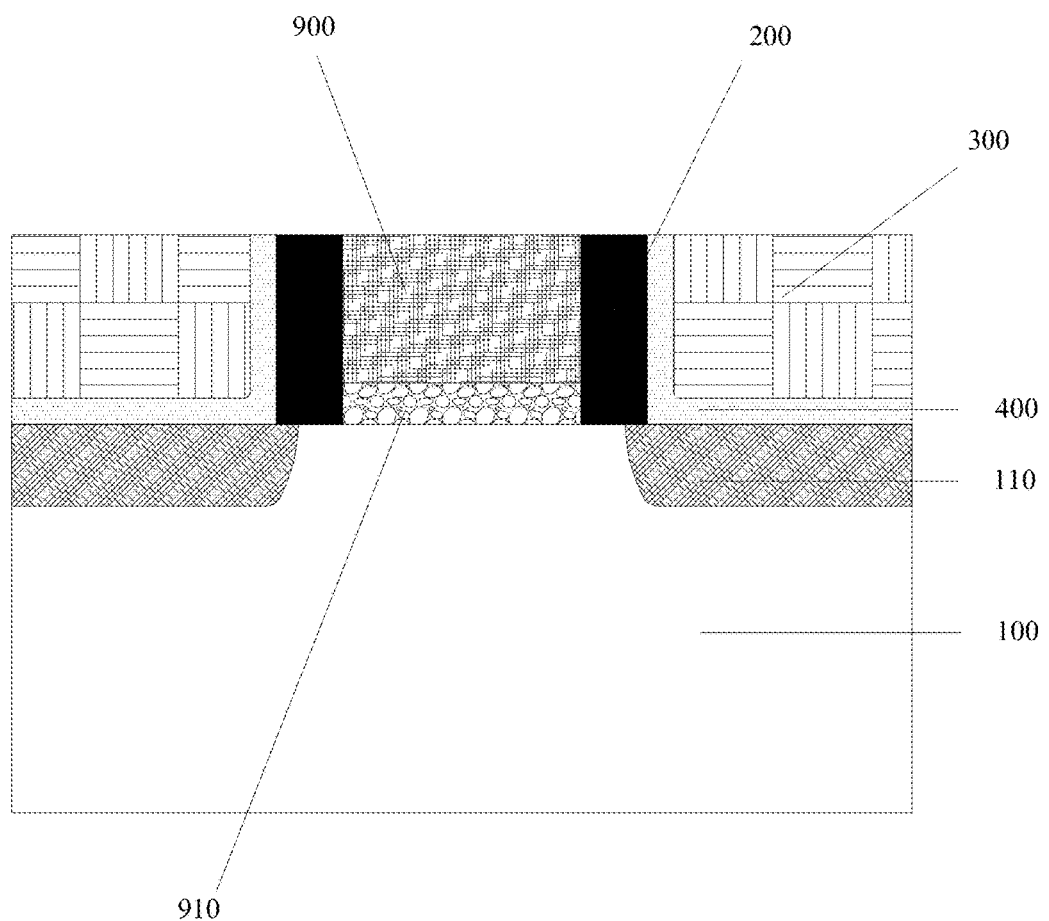
FIG. 8 is a cross-sectional view of a semiconductor structure at the stage of removing the silicon nitride layer in an embodiment according to the present invention.
Figure 9:
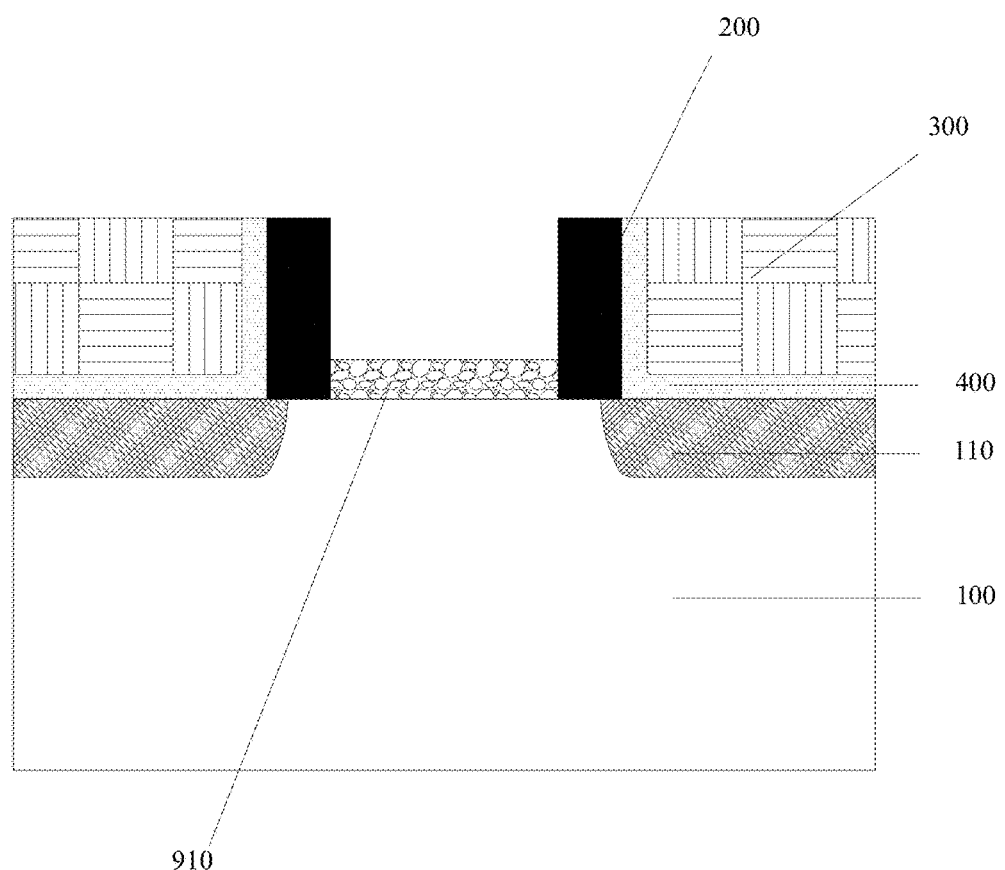
FIG. 9 shows a cross-sectional view of a semiconductor structure at the stage of removing a dummy gate electrode in an embodiment according to the present invention.

In the first stage, referring to FIGS. 7-9, a dummy gate dielectric layer 910 and a dummy gate electrode 900 are formed on a surface of the semiconductor substrate 100 and sidewall spacers 200 are formed on opposing sides of the dummy gate electrode 900 and the dummy gate dielectric layer 910. Impurities are implanted to the semiconductor substrate 100, whereby source/drain regions are formed in the semiconductor substrate 100 on opposing sides of the dummy gate electrode 900. Then the semiconductor substrate 100 is annealed to activate and diffuse the implanted impurities in the source/drain regions, as well as to repair the primary crystal damage caused by the implantation. After that, a metal silicide 110 is formed in the upper portion of the source/drain regions. An interlayer insulating layer 400 such as a silicon nitride layer and an interlayer dielectric layer 300 are deposited on the metal silicide 110, the sidewall spacers 200 and the dummy gate electrode 900. The portion of the silicon nitride layer 400 and interlayer dielectric layer 300 above the dummy gate electrode 900 is removed by chemical mechanical polishing. Then the dummy gate electrode 900 is removed. Generally, the material of the dummy gate electrode 900 is polysilicon. It can be removed by dry etching or wet etching.

Figure 10:
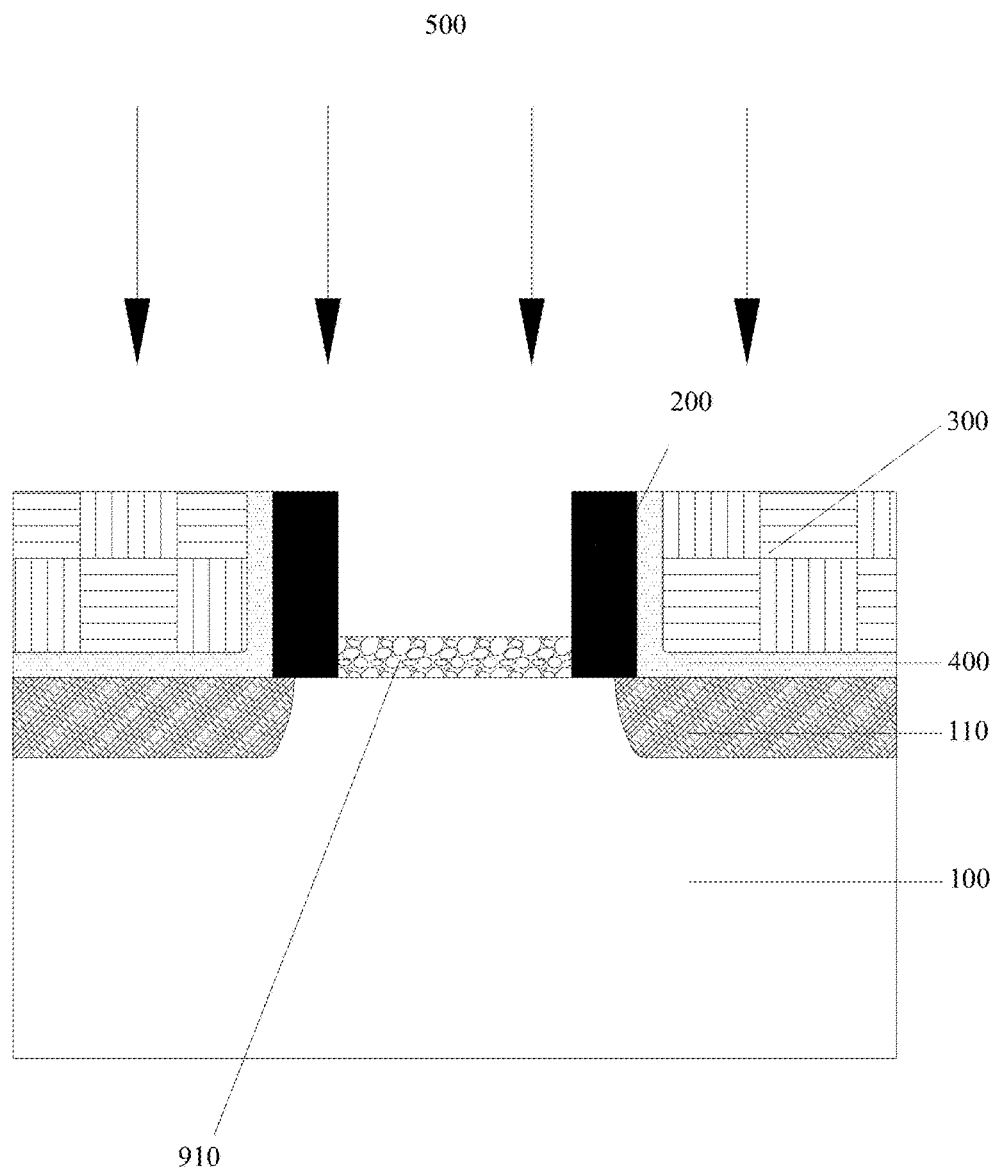
FIG. 10 shows a cross-sectional view of a semiconductor structure at the stage of removing a dummy gate dielectric layer by a plasma containing F in an embodiment according to the present invention.

The dummy gate dielectric layer 900 is exposed after the dummy gate electrode 900 being removed. The dummy gate dielectric layer 910 contains Si and O. In most cases, the dummy gate dielectric layer 910 is composed of $SiO_2$, and in rare cases, it is composed of SiNO. Referring to FIG. 10, the dummy gate dielectric layer 910 is removed by utilizing a first plasma 500, which contains $NF_3$ and $NH_3$. $NF_3$ and $NH_3$ dissociate to form plasma products such as free H and F radicals, HF, $N_2$, $NH_4F$ and/or $NH_4F.HF$. HF and $SiO_2$ can react at room temperature to form hexafluorosilicic acid ($H_2SiF_6$) and $NH_4F$, which further reacts with $SiO_2$ to form ammonium hexafluorosilicate $(NH_4)_2SiF_6$. Finally, $(NH_4)_2SiF_6$, $NH_4F$ and $H_2O$ are generated. $(NH_4)_2SiF_6$ is solid at room temperature, but readily decomposed into gaseous products of $SiF_4$, $NH_3$ and $H_F$ when heated at a temperature over 100° C. and leaves the semiconductor device.

However, the $(NH_4)_2SiF_6$ may enter into the complicated structure of the semiconductor device where the ambient temperature is lower than the decomposition temperature, which leads to incomplete decomposition of the $(NH_4)_2SiF_6$. Even if the $(NH_4)_2SiF_6$ is completely decomposed into gaseous products, it may react with the materials in the semiconductor device to produce fluorinated compound on the semiconductor device. The fluorine residue is likely to enter into the silicon lattice structures of the semiconductor device due to its small size and breaks the integrity of silicon lattice structures, causing electron movement through lattice structures, inversion layer offset and increased gate current leakage.

Figure 11:
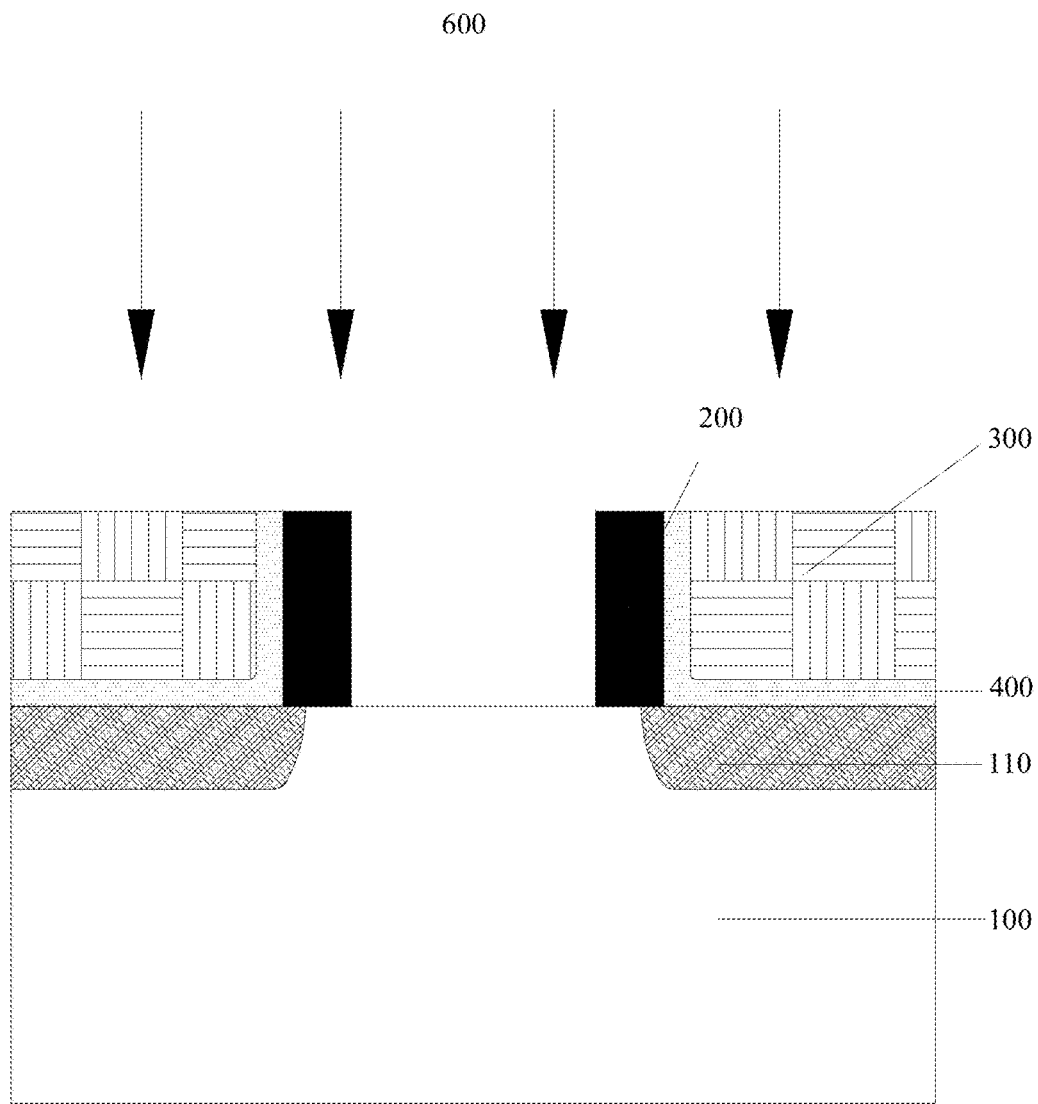
FIG. 11 shows a cross-sectional view of a semiconductor structure at the stage of performing a plasma treatment after removing the dummy gate dielectric layer in an embodiment according to the present invention.

In a second stage, referring to FIG. 11, the semiconductor device is bombarded with a second plasma 600 containing $H_2$. The second plasma can be completely $H_2$ plasma, or $H_2$ and $N_2$ plasma. The second plasma 600 can be a local plasma which is formed in a plasma generator inside a reaction chamber or a remote plasma which is formed in a plasma generator outside the reaction chamber and introduced into the reaction chamber through pipelines. Compared with the local plasma, the remote plasma has the advantage of soft bombardment, small impact, and slight damages to the semiconductor device.

When the second plasma is $H_2$, it bombards the semiconductor device at a temperature between 0° C. and 400° C., at a flow rate between 1000 sccm to 15000 sccm, at a radio-frequency power between 50 W to 1500 W.

When the second plasma is $H_2/N_2$ plasma, it bombards the semiconductor device at a temperature between 0° C. and 400° C., at a flow of $H_2$ between 1000 sccm to 15000 sccm and a flow of $N_2$ between 1000 sccm and 20000 sccm, and at a radio-frequency power between 50 W and 1500 W.

By using the second plasma 600 containing $H_2$ to bombard the semiconductor device, the $H_2$ will react with the fluorinated compound on the semiconductor device and produce gaseous product HF, which takes the fluorine element away from semiconductor device.

In some embodiments, the second plasma 600 treatment and the first plasma 500 treatment are performed in a same reaction chamber without breaking vacuum. While in some embodiments, the first plasma 500 and the second plasma 600 are introduced into different reaction chambers in the same process equipment. Once the first plasma bombardment is completed, the semiconductor device is exposed to the ambient environment (i.e., break vacuum) and transferred to another chamber, where the second plasma bombardment is performed.

Figure 12:
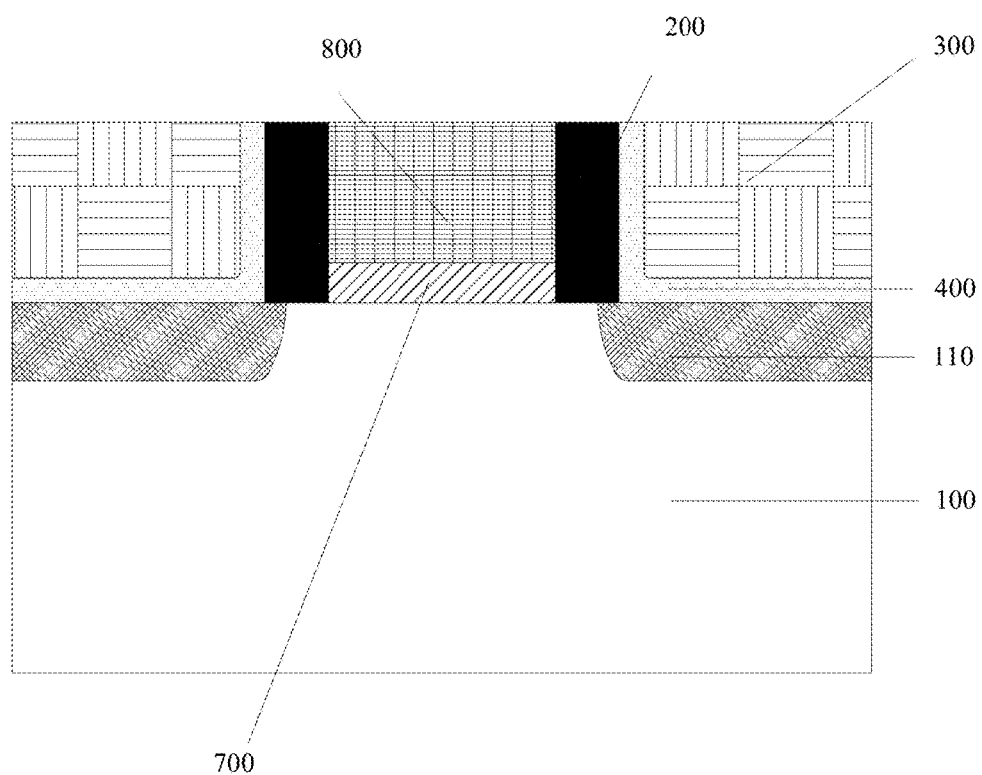
FIG. 12 shows a cross-sectional view of a semiconductor structure at the stage of forming a gate dielectric layer and a metal gate in an embodiment according to the present invention.

In the third stage, as illustrated in FIG. 12, after the fluorine element on the surface of the semiconductor device being removed by the second plasma 600 as mentioned above, a high-k gate dielectric layer 700 is formed on the surface of semiconductor substrate 100 within the sidewall spacers 200. Then a metal gate 800 is formed on the gate dielectric layer 700. The material of the high-k gate dielectric layer 700 can be $HfO_2$ or $ZrO_2$.

In summary, according to the present invention, a first plasma 500 containing F is used to remove the dummy gate dielectric layer 910 and then a second plasma 600 containing $H_2$ is used to react with fluorinated compound on the surface of semiconductor device to form gaseous product HF, which takes the fluorine element away from the semiconductor device. Since the content of the fluorine element on the semiconductor substrate 100 is reduced, the effect of the fluorine element on the inversion layer of the semiconductor device and the gate current leakage in subsequent process steps is minimized.

Although the present invention has been disclosed as above with respect to the preferred embodiment, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method of forming a metal gate comprising the steps of:
    forming a dummy gate dielectric layer and a dummy gate electrode on a surface of a semiconductor substrate;
    forming sidewall spacers on opposing sides of dummy gate electrode and the dummy gate dielectric layer;
    forming source/drain regions in the semiconductor substrate;
    depositing an interlayer insulating layer and an interlayer dielectric layer;
    removing a portion of the interlayer insulating layer and the interlayer dielectric layer above the dummy gate electrode to expose the dummy gate electrode;
    removing the dummy gate electrode;
    removing the dummy gate dielectric layer by a first plasma to expose the semiconductor substrate;
    then removing a fluorinated compound on the surface of the semiconductor substrate by a second plasma;
    forming a gate dielectric layer and a metal gate in sequence on the surface of the semiconductor substrate within sidewall spacers;
    wherein a material of the dummy gate dielectric layer contains Si and O; the first plasma contains F, and the second plasma contains $H_2$.

2. The method according to claim 1, wherein a dielectric constant of the gate dielectric layer is higher than that of the dummy gate dielectric layer.

3. The method according to claim 1, wherein a material of gate dielectric layer is $HfO_2$ or $ZrO_2$.

4. The method according to claim 1, wherein the first plasma contains $NF_3$ and $NH_3$.

5. The method according to claim 1, wherein the second plasma is a remote plasma.

6. The method according to claim 1, wherein the second plasma is $H_2$ plasma which removes the fluorinated compound at a temperature between 0° C. to 400° C., at a flow rate between 1000 sccm to 15000 sccm, and at a radio-frequency power between 50 W to 1500 W.

7. The method according to claim 1, wherein the second plasma is H2/N2 plasma which removes the fluorinated compound at a temperature between 0° C. to 400° C., at a flow rate of N2 between 1000 sccm to 15000 sccm and a flow rate of N2 between 1000 sccm to 20000 sccm, and at a radio-frequency power between 50 W to 1500 W.

8. The method according to claim 1, wherein the step of removing a dummy gate dielectric layer on a surface of a semiconductor substrate by a first plasma and the step of removing a fluorinated compound on the surface of the semiconductor substrate by a second plasma are performed in a same reaction chamber.

9. The method according to claim 1 wherein a material of the dummy gate dielectric layer contains $SiO_2$ or SiNO.

10. A method of removing a dummy gate dielectric layer comprising the steps of:
   removing a dummy gate dielectric layer on a surface of a semiconductor substrate by a first plasma to expose the semiconductor substrate;
   then removing a fluorinated compound on the surface of the semiconductor substrate by a second plasma;
   wherein a material of the dummy gate dielectric layer contains Si and O; the first plasma contains F, and the second plasma contains $H_2$.

11. The method according to claim 10, wherein the first plasma contains $NF_3$ and $NH_3$.

12. The method according to claim 10, wherein the second plasma is a remote plasma.

13. The method according to claim 10, wherein the second plasma is $H_2$ plasma which removes the fluorinated compound at a temperature between 0° C. to 400° C., at a flow rate between 1000 sccm to 15000 sccm, and at a radio-frequency power between 50 W to 1500 W.

14. The method according to claim 10, wherein the second plasma is H2/N2 plasma which removes the fluorinated compound at a temperature between 0° C. to 400° C., at a flow rate of N2 between 1000 sccm to 15000 sccm and a flow rate of N2 between 1000 sccm to 20000 sccm, and at a radio-frequency power between 50 W to 1500 W.

15. The method according to claim 10, wherein the step of removing a dummy gate dielectric layer on a surface of a semiconductor substrate by a first plasma and the step of removing a fluorinated compound on the surface of the semiconductor substrate by a second plasma are performed in a same reaction chamber.

16. The method according to claim 10 wherein a material of the dummy gate dielectric layer contains $SiO_2$ or SiNO.

* * * * *